United States Patent
Li et al.

(10) Patent No.: US 6,475,703 B2
(45) Date of Patent: *Nov. 5, 2002

(54) METHOD FOR CONSTRUCTING MULTILAYER CIRCUIT BOARDS HAVING AIR BRIDGES

(75) Inventors: Delin Li, Canton, MI (US); Achyuta Achari, Canton, MI (US); Alice Dawn Zitzmann, Belleville, MI (US); Robert Edward Belke, Jr., West Bloomfield, MI (US); Brenda Joyce Nation, Troy, MI (US); Edward McLeskey, Waterford, MI (US); Mohan R. Paruchuri, Canton, MI (US); Lakhi Nandlal Goenka, Ann Arbor, MI (US)

(73) Assignee: Visteon Global Technologies, Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/203,148

(22) Filed: Dec. 1, 1998

(65) Prior Publication Data

US 2002/0086243 A1 Jul. 4, 2002

(51) Int. Cl.[7] .............................. G03C 5/56; G03C 5/58; B05D 1/36
(52) U.S. Cl. ...................... 430/313; 430/315; 430/329; 216/15; 216/16; 216/20; 427/404; 427/405; 427/471; 427/532
(58) Field of Search ................................ 430/313–329; 216/15–20; 427/404–532

(56) References Cited

U.S. PATENT DOCUMENTS

| | | | |
|---|---|---|---|
| 3,801,388 A | 4/1974 | Akiyama et al. | 216/20 |
| 4,404,059 A | 9/1983 | Livshits et al. | 216/17 |
| 5,738,797 A | 4/1998 | Belke, Jr. et al. | 216/16 |
| 5,976,391 A | * 11/1999 | Belke, Jr. et al. | 216/13 |

* cited by examiner

*Primary Examiner*—Mark F. Huff
*Assistant Examiner*—Deborah Chacko-Davis
(74) *Attorney, Agent, or Firm*—Brinks Hofer Gilson & Lione

(57) ABSTRACT

A multilayer circuit board having air bridge crossover structures and an additive method for producing the same, wherein the circuit includes specially designed metallic fortifying layers to mechanically and/or electrically fortify the circuit.

12 Claims, 4 Drawing Sheets

PROCESS I

PROCESS II

METHOD FOR CONSTRUCTING MULTILAYER CIRCUIT BOARDS HAVING AIR BRIDGES

BACKGROUND OF THE INVENTION

1. Field of the Invention

The present invention relates generally to multilayer circuit boards, and more particularly to multilayer circuit boards having air bridge crossover circuits.

2. Disclosure Information

U.S. Pat. No. 4,404,059 to Livshits et al. (hereinafter "Livshits"), U.S. Pat. No. 3,801,388 to Akiyama et al. (hereinafter "Akiyama"), and U.S. Pat. No. 5,738,797 to Belke et al. (hereinafter "Belke"), all three of which are incorporated herein by reference, describe additive and subtractive plating and chemical etching processes for constructing multilayer (i.e., two-or-more-layer) circuit boards having air bridges. As typified in FIGS. 1A and 2A–F (and in FIGS. 1a–h of Livshits), the additive process involves the following steps. First (FIG. 2A), a thin metal foil 10 made of a first metal is provided having opposed top and bottom surfaces 12/14. Second (FIG. 2B), top and bottom etch-resist masks 22/24 are disposed on the respective top and bottom foil surfaces, wherein the top and bottom masks have apertures 23/25 therein which define respective first and second conductor patterns. Third (FIG. 2C), top and bottom conductor networks 32/34 made of a second metal are electrodeposited through the mask apertures and onto the respective top and bottom foil surfaces. Fourth (FIG. 2D), the masks are stripped off, fifth (FIG. 2E), the structure is attached to an electrically insulative surface 61 of a substrate 60, and sixth (FIG. 2F) the structure is exposed to an etchant which etches substantially only the first metal, so as to etch away substantially all of the metal foil except for those portions 16 sandwiched between the top and bottom conductor networks. These sandwiched portions 16 are much less aggressively etched because the top and bottom conductor networks act essentially as etchresist masks, since the metal of these networks is not appreciably etched by the aforementioned etchant. After etching, these sandwiched portions 16 typically assume an hour-glass-like shape, and may be referred to as "pedestals", "support elements", or the like.

Air bridge crossover circuits are advantageous in that they facilitate high density circuits—that is, they permit the arrangement of a high number of circuit traces and other circuit elements into a small circuit board area. However, such circuits sometimes suffer from at least one of the following two problems: (1) susceptibility to mechanical damage, from impact, thermal excursions, and the like; and (2) poor electrical performance, caused by the use of certain metals having poor electrical conductance characteristics as the conductor network material. It would be desirable, therefore, to provide a way of creating such multilayer air bridge circuits without these drawbacks.

SUMMARY OF THE INVENTION

The present invention overcomes the disadvantages of the prior art approaches by providing a multilayer air bridge circuit structure, and method for producing the same, which has special metallic fortifying layers which mitigate the aforementioned disadvantages.

It is an object and advantage that the present invention includes such fortifying layers made of a metal selected such that the air bridge structure is mechanically and/or electrically fortified.

Another advantage is that the present invention may be easily and economically incorporated into the conventional air bridge circuit construction process.

These and other advantages, features and objects of the invention will become apparent from the drawings, detailed description and claims which follow.

DETAILED DESCRIPTION OF THE PREFERRED EMBODIMENTS

Figures 1A, 1B, 1C:
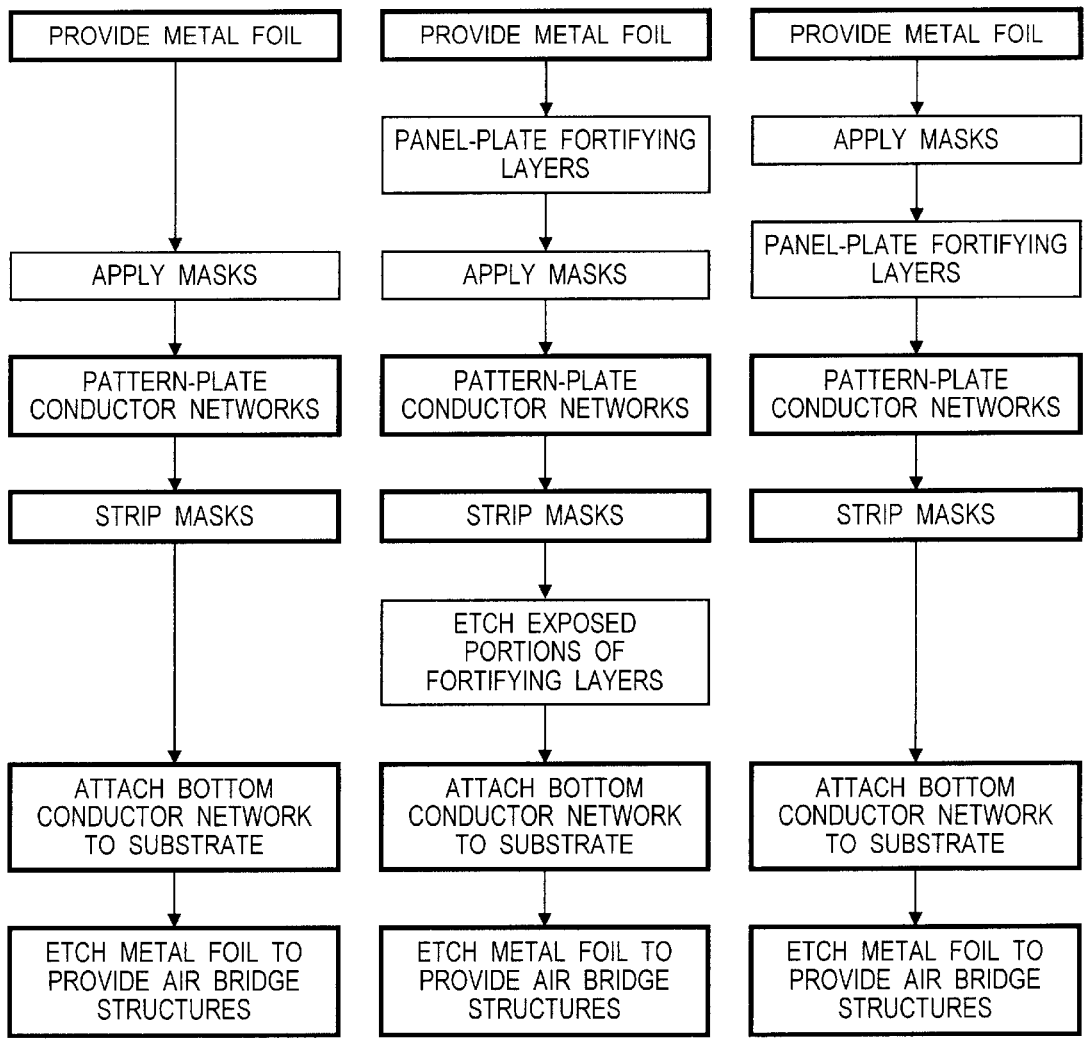
FIG. 1A is a flowchart of the steps for producing a multilayer air bridge circuit according to the prior art.
FIGS. 1B–C are flowcharts of the steps for producing a multilayer air bridge circuit according to two related embodiments of the present invention.

Referring now to the drawings, FIGS. 1B–C, 3A–H, and 4A–G illustrate two related processes for producing a multilayer circuit board having air bridge crossovers. These two processes—hereinafter referred to as Processes I and II (i.e., the first and second embodiments, respectively)—are related in that each includes the step of providing special metallic fortifying layers during the circuit construction process, so as to electrically and/or mechanically fortify the overall circuit.

Figure 3A:
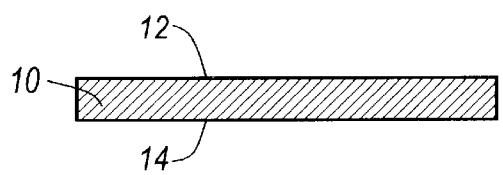
FIGS. 3A–H are successive sectional side views of a multilayer air bridge circuit being produced according to a first embodiment of the present invention.
Figure 3E:
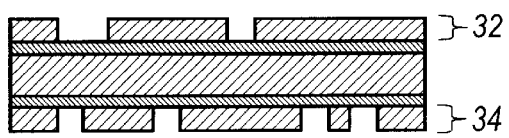
Figure 3B:
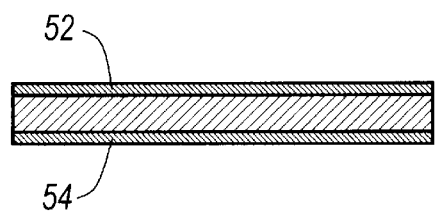
Figure 3F:
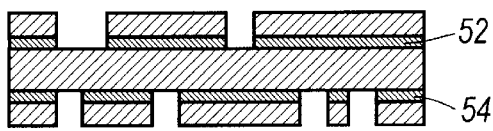
Figure 3C:
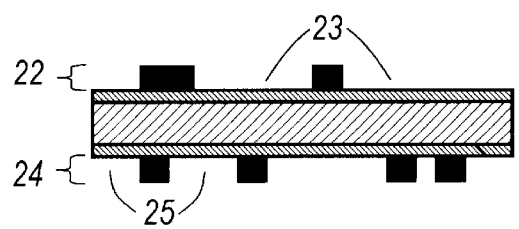
Figure 3G:
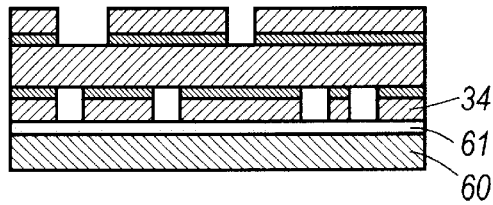
Figure 3D:
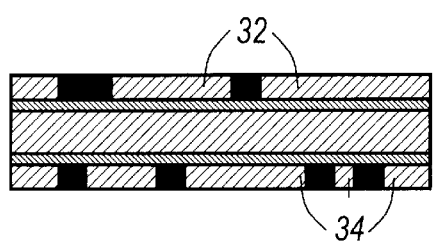
Figure 3H:
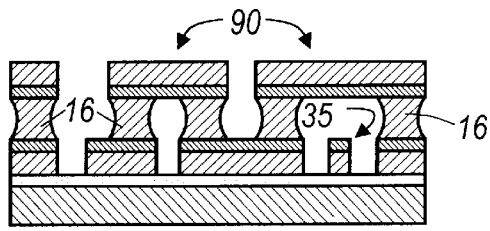
Figure 4A:
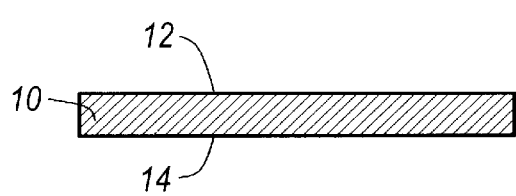
FIGS. 4A–G are successive sectional side views of a multilayer air bridge circuit being produced according to a second embodiment of the present invention.
Figure 4E:
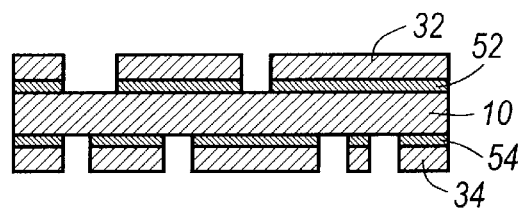
Figure 4B:
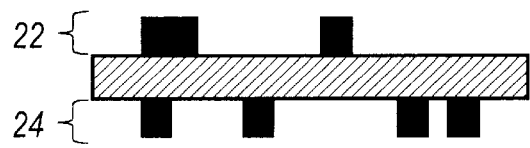
Figure 4F:
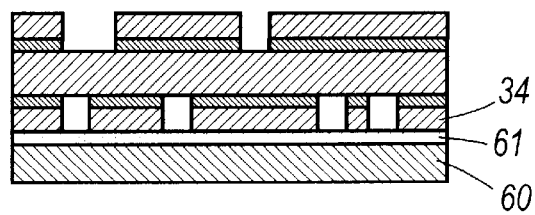
Figure 4C:
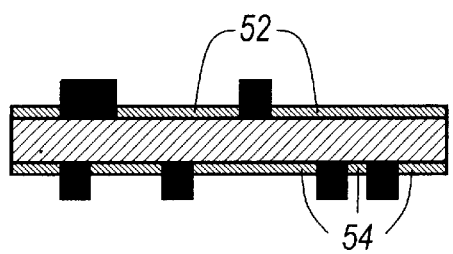
Figure 4G:
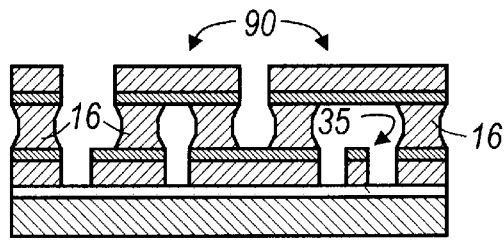
Figure 4D:
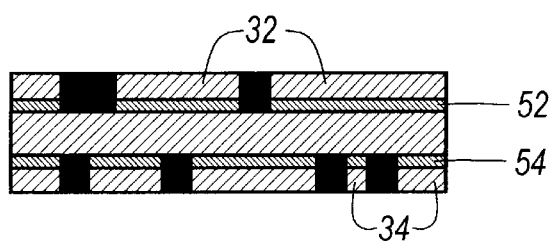

To assist the reader in understanding the present invention, all reference numbers used herein are summarized in the table below, along with the elements they represent:

10=Metal foil
12=Top surface of metal foil
14=Bottom surface of metal foil
16=Pedestal/support element of air bridge
22=Top etch-resist mask
23=Apertures in top mask
24=Bottom etch-resist mask
25=Apertures in bottom mask
32=Top conductor network
33=Bridging element in top conductor network
33e=Enlarged end of bridging element
33c=Constricted portion of bridging element
34=Bottom conductor network
35=Circuit trace
36=Support element pad
52=Top fortifying layer
54=Bottom fortifying layer
60=Substrate
61=Electrically insulative adhesive on substrate
90=Air bridge crossover structure Turning now to the specific embodiments, Process I is illustrated in FIGS. 1B and 3A–H. This process involves the steps of: (a) providing a metal foil 10 made of a first metal and having top and bottom foil surfaces 12/14 (FIG. 3A); (b) panel-plating top and bottom fortifying layers 52/54 made of a second metal onto the top and bottom foil surfaces 12/14, respectively (FIG. 3B); (c) applying top and bottom plating resist masks 22/24 to the top and bottom fortifying layers 52/54, respectively, wherein the top and bottom plating resist masks have respective apertures 23/25 defined therein corresponding to respective predefined top and bottom conductor patterns (FIG. 3C); (d) pattern-plating top and bottom conductor networks 32/34 made of a third metal onto the top and bottom fortifying layers 52/54, respectively, through the apertures 23/25 in the top and bottom plating resist masks 22/24 (FIG. 3D); (e) stripping the top and bottom plating resist masks 22/24, thereby exposing formerly-masked portions of the fortifying layers (FIG. 3E); (f) etching away the formerly-masked portions of the fortifying layers (FIG. 3F); (g) attaching the bottom conductor network 34 to a substrate 60 through an electrically insulative adhesive 61 (FIG. 3G); and (h) etching away the metal foil 10 except for those portions 16 sandwiched between the top and bottom conductor networks, thereby forming air bridge crossover structures 90 (FIG. 3H).

In order to overcome the aforementioned mechanical and electrical problems associated with many prior art air bridge circuits, it is important that the second metal (i.e., the fortifying layers) be selected such that it is not only platable to the first metal of the central foil 10, but also has a higher flex modulus and/or a higher electrical conductance than that of the third metal used to form the conductor networks 32/34. (Either or both of these criteria may be used to select the second metal, depending on whether it is desired to fortify the air bridge circuit mechanically, electrically, or both.) For example, if it is desired to electrically fortify a Ni—Cu—Ni air bridge circuit (i.e., first metal/central foil= Cu, third metal/conductor networks=Ni) due to the poor electrical conductance of Ni, one may choose Au (gold) as a suitable second metal, because it is platable onto both Ni and Cu and has much greater electrical conductance than does Ni. As another example, if it is desired to mechanically fortify a Cu-steel-Cu circuit (i.e., first metal=steel, third metal =Cu) due to the poor mechanical properties of Cu, one may choose Ni as a suitable second metal, because it is platable to both Cu and steel and has a much higher flex modulus (and other enhanced mechanical properties) as compared to Cu. As yet another example, Ni may also be used as the second metal when it is desired to improve the mechanical properties of a Cu—Al—Cu circuit, because it is platable to both Cu and Al and has a higher flex modulus than does Cu. Several other metals may be used as a suitable second metal in each of the above examples, and there are many other first metal/third metal combinations available besides the three specifically mentioned herein, yet each of these additional combinations is within the scope of the present invention.

Additionally, whether using the prior art approach or one of the present invention approaches, the multilayer air bridge circuit designer must be careful to select metals for the various circuit layers which satisfy at least two further criteria: (1) the metals of adjacent layers must be platable onto each other in the prescribed order (and to the required thickness), either directly or through optional conversion layers (discussed below), and (2) the metals must be selectively etchable with respect to each other. (By "selectively etchable" it is meant that one or more selected metals must be etchable in a given etchant without the etchant appreciably etching the other metals.)

As known in the art, a "conversion layer" is sometimes interposed between two layers of different metals when it may be difficult to plate one of these two metals onto the other. Typically the conversion layer metal is made of yet another different metal onto which both of the first two metals may be easily plated. For example, in a preferred embodiment, the metal foil 10 (first metal) may be aluminum, each fortifying layer 52/54 (second metal) may be nickel, and each conductor layer 32/34 (third metal) may be copper; however, because it is difficult to plate nickel directly onto aluminum, a conversion layer (fourth metal) of zincate or silver may be applied atop the aluminum before nickel plating. For this embodiment, the aluminum foil 10 is preferably about 6 mils thick, each conversion layer is only about 2–10 $\mu$in thick [e.g., 2–5 $\mu$in for zincate, or 2–10 $\mu$in for silver], each fortifying layer 52/54 is about 2 to 3 times the conversion layer thickness (i.e., 4–30 $\mu$) and each conductor network 32/34 about 2 mils thick. Conversion layers may be placed between the metal foil 10 and the fortifying layers 52/54, and/or between the fortifying layers 52/54 and the conductor layers 32/34. Of course, a given conversion "layer" may actually comprise two or more different metal layers, depending on the particular metallurgies involved.

While electrolytic plating may be a preferred plating method for many of the plating steps mentioned herein, it is also possible that electroless, immersion, or other methods of plating may also be used. For example, with a central foil 10 made of aluminum, conversion layers of zincate (i.e., $Zn(OH)_4^{2-}$ ion in strong alkaline solution) may be electrolytically plated onto the foil, or, alternatively, conversion layers of silver may be immersion plated thereon. It should be noted, however, that although the terms "pattern-plating" and "panel-plating" are variously used herein, methods of metal deposition other than "plating" may alternatively be used and are within the scope of the present invention. Examples of such alternative but equivalent processes include, but are not limited to, sputtering, vacuum metallization/deposition, thermal spraying, dip coating, and the like. Thus, as used herein, any reference to "plating" (including pattern-plating and panel-plating) should be construed to include the foregoing approaches and their equivalents.

Figure 2A:
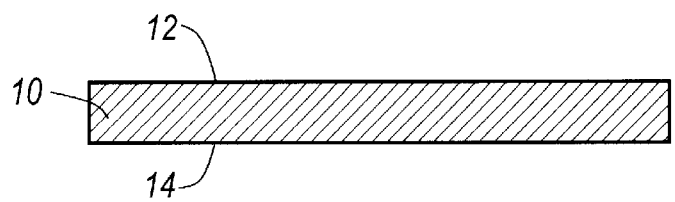
FIGS. 2A–F are successive sectional side views of a multilayer air bridge circuit being produced according to the prior art.
Figure 2B:
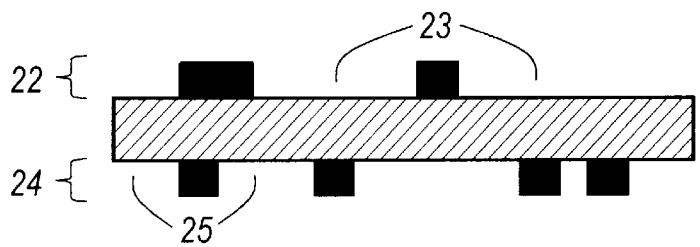
Figure 2C:
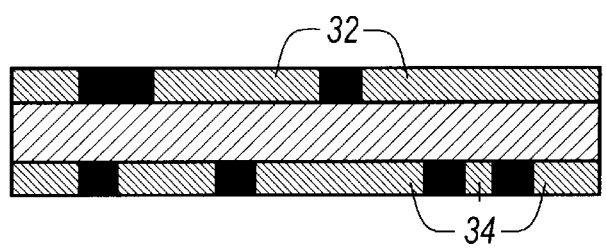
Figure 2D:
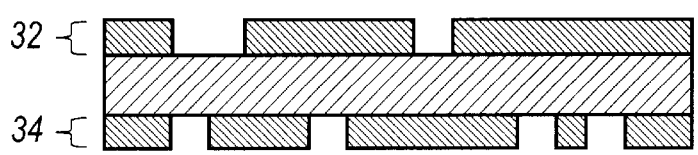
Figure 2E:
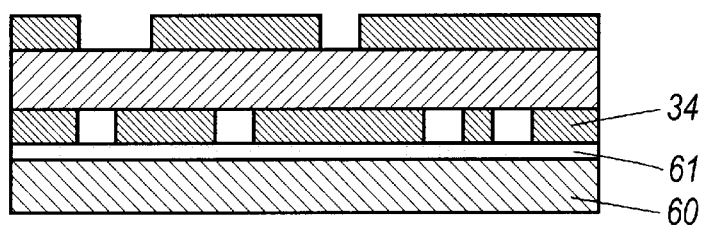
Figure 2F:
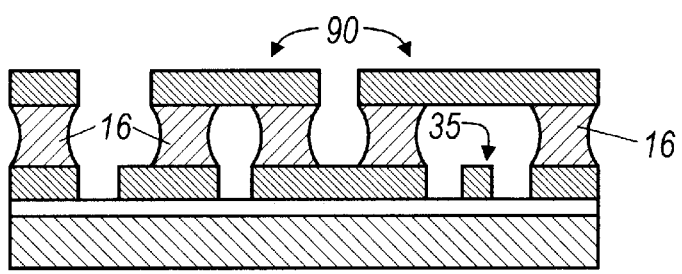

The aforementioned plating resist masks 22/24 are typically produced by well known photoimaging processes. Defined within the masks 22/24 are respective apertures 23/25 which correspond to respective predefined top and bottom conductor patterns. When the conductor networks 32/34 are pattern-plated onto the fortifying layers 52/54 through these apertures 23/25, the third metal essentially fills up the apertures in the shape of the predefined conductor patterns, thereby creating the top and bottom conductor networks 32/34. As taught in Livshits, Akiyama and Belke, the bottom conductor network 34 generally comprises a plurality of circuit traces 35 and support element pads 36; typically, the support element pads 36 are arranged in pairs proximate a corresponding circuit trace 35, with one pad 36 on either side of the trace 35. The top conductor network 32 comprises at least one bridging element 33 having first and second enlarged ends 33e with at least one constricted portion 33c contiguous with and between (i.e., connecting) the enlarged ends, such as the 15 "dumbbell" shapes illustrated in FIGS. 1h and 2c of Livshits. Each bridging element 33 is generally oriented transverse to a corresponding circuit trace, with each enlarged end thereof disposed opposite/atop a respective one of the support element pads.

After the conductor networks 32/34 are pattern-plated through the mask apertures, the masks 22/24 are stripped away, thereby exposing the formerly-masked portions of the fortifying layers (i.e., those portions of the fortifying layers not covered by the conductor networks 32/34). Then, the formerly-masked fortifying layer portions are etched away. At this point, the bottom conductor network 34 is attached to a substrate 60 via an electrically insulative adhesive layer 61. The substrate 60 may be metal, plastic, ceramic, or any other suitable material, with the adhesive 61 being, for example, a thermoset epoxy. (It is required that the adhesive 61 be electrically insulative in order to avoid shorts among the bottom conductor network elements.) Finally, the metal foil 10 is etched away, except for those portions 16 sandwiched between the top and bottom conductor networks 32/34; these sandwiched portions are the "pedestals" or "support elements" 16 mentioned above, which serve to interconnect the top and bottom conductor networks 32/34 in such a way as to form the aforementioned air bridge crossover structures 90.

It should be noted that whenever reference is made herein to "etching" a particular structure, it is generally intended that an etchant be used which etches substantially only the metal of which that particular structure is made. For example, when it is mentioned that the metal foil 10 is to be etched, it is meant that the etchant used will etch substantially only the first metal (e.g., aluminum) and will not appreciably etch the second, third, and optional fourth metals (e.g., nickel, copper, and zincate/silver, respectively). However, for the sake of efficiency, it may be desirable to combine certain successive steps by using an etchant which etches all of the metals to be etched in such steps. For example, it may be more practical to combine the steps of etching the fortifying layers and any optional conversion layers into a single step, using a single etchant, particularly in light of fact that the conversion layers are typically so thin. As an alternative example, rather than combining the fortifying layer and conversion layer etching steps, it may be desired to combine the conversion layer and metal foil etching steps, such as by delaying the conversion layer etching step until after the attaching step and performing the conversion layer and metal foil etching steps generally simultaneously.

The next embodiment—Process II—is illustrated in FIGS. 1C and 4A–G. This process is similar to that of Process I described above, except that the masks 22/24 are applied immediately before the plating of the fortifying layers 52/54, rather than immediately afterward. This makes the plating of the fortifying layers 52/54 onto the foil surfaces 12/14 a pattern-plating step rather than a panel-plating step, because the fortifying layers 52/54 are plated through only the mask apertures 23/25, rather than cross the entire surface of the conversions layers. Also, since the fortifying layers 52/54 are already applied in the desired top and bottom conductor patterns, no subsequent fortifying layer etching step is needed. These differences between Processes I and II may be noted by comparing FIGS. 1B–C. As with Process I, optional conversion layers may be interposed between any of the foil surfaces, the fortifying layers, and the conductor network layers as needed, depending upon the metals selected.

Although Processes I and II are slightly different from one another as far as the specific sequence of steps each process follows, the final multilayer air bridge circuit structures produced by these processes are substantially identical. This is made clear by comparing the final structures shown in FIGS. 3H and 4G.

For those constructions where mechanical fortification is desired (e.g., Cu—Al—Cu), the fortification layers 52/54 are made of a metal (e.g., Ni) having a higher flex modulus than that of the third metal (e.g., Cu), thus mechanically fortifying the entire circuit structure. This provides a more mechanically robust circuit which can better withstand thermal excursions, bending, impact, and the like. For those constructions where electrical fortification is desired (e.g., Ni—Cu—Ni), the fortification layers 52/54 are made of a metal (e.g., Au) having a higher electrical conductance than that of the third metal (e.g., Ni), thus electrically fortifying the entire circuit structure. With the electrical fortification layers thus provided, electric current may flow preferentially through the Au layer "atop" the circuit traces, up a Cu support element 16, across the "underside" Au layer the bridging element, down the other Cu support element 16, and across further Au traces, effectively electrically "bypassing" the Ni portions of the circuit in preference for the Au portions.

Various other modifications to the present invention may occur to those skilled in the art to which the present invention pertains. For example, it should be apparent that performing one or more cleaning, microetching, or other metal-prep steps may be desired prior to any given plating step. Also, while the "etching" steps herein have been described generally in terms of chemical etching, equivalent processes such as plasma etching, laser ablation, and other metal removal steps may be used instead of or in addition to conventional chemical etching. Other modifications not explicitly mentioned herein are also possible and within the scope of the present invention. It is the following claims, including all equivalents, which define the scope of the present invention.

What is claimed is:

1. A method for producing a multiplayer circuit board having air bridge crossovers, comprising the steps of:
   (a) providing a metal foil made of a first metal or alloy, wherein the metal foil has top and bottom foil surfaces;
   (b) panel-plating top and bottom fortifying layers made of a second metal onto the top and bottom foil surfaces;
   (c) applying top and bottom plating resist masks to the top and bottom fortifying layers, wherein the top and bottom plating resist masks have respective apertures defined therein corresponding to respective predefined top and bottom conductor patterns;
   (d) pattern plating top and bottom conductor networks made of a third metal onto the top and bottom fortifying layers, through the apertures in the top and bottom plating resist masks;
   (e) stripping the top and bottom plating resist masks, wherein the top and bottom conductor networks mask portions of the top and bottom fortifying layers, and expose, formerly-masked portions of the fortifying layers;
   (f) etching away the formerly-masked portions of the fortifying layers;
   (g) attaching the bottom conductor network to a substrate through an electrically insulative adhesive; and
   (h) etching away the metal foil except for those portions thereof sandwiched between the top and bottom conductor networks, thereby forming air bridge crossover structures, wherein the second metal has a higher flex modulus and a higher electrical conductance than that of the third metal.

2. A method according to claim 1, wherein step (f) is performed simultaneously with step (h) after step (g).

3. A method according to claim 1, further comprising the step of cleaning the top and bottom foil surfaces immediately after step (a) so as to remove any oxidized material.

4. A method according to claim 1, wherein:

the bottom conductor network includes a circuit trace and first and second support element pads disposed proximate the circuit trace on opposite sides thereof; and the top conductor network includes a bridging element having first and second enlarged ends and at least one constricted portion therebetween, the bridging element being oriented generally transverse to the circuit trace with each enlarged end disposed opposite a respective one of the support element pads.

5. A method according to claim 1, wherein the metal foil is selected from a group consisting of aluminum, copper and steel, the second metal is selected from a group consisting of nickel and gold, the third metal is selected from a group consisting of copper and nickel.

6. A method according to claim 5, wherein the metal foil is aluminum, the second metal is nickel and the third metal is copper.

7. A method according to claim 5, wherein the metal foil is copper, the second metal is gold and the third metal is nickel.

8. A method according to claim 5, wherein the metal foil is steel, the second metal is nickel and the third metal is copper.

9. A method for producing a multilayer circuit board having air bridge crossovers, comprising the steps of:

(a) providing a metal foil made of a first metal or an alloy wherein the metal foil has top and bottom foil surfaces;

(b) applying top and bottom plating resist masks to the top and bottom foil surfaces, wherein the top and bottom plating resist masks have respective apertures defined therein corresponding to a predefined top and bottom conductor patterns;

(c) pattern-plating top and bottom fortifying layers made of a second metal onto the top and bottom foil surfaces, through the apertures in the top and bottom plating resist masks;

(d) pattern-plating top and bottom conductor networks made of a third metal onto the top and bottom fortifying layers, through the apertures in the top and bottom plating resist masks, wherein the top and bottom conductor networks mask portions of the top and bottom fortifying layers;

(e) stripping the top and bottom plating resist masks;

(f) attaching the bottom conductor network to a substrate through an electrically insulative adhesive; and (g) etching away the metal foil except for those portions thereof sandwiched between the top and bottom conductor networks, thereby forming air bridge crossover structures, wherein the second metal has a higher flex modulus and a higher electrical conductance than that of the third metal.

10. A method according to claim 9, wherein:

the bottom conductor network includes a circuit trace and first and second support element pads disposed proximate the circuit trace on opposite sides thereof; and the top conductor network includes a bridging element having first and second enlarged ends and at least one constricted portion therebetween, the bridging element being oriented generally transverse to the circuit trace with each enlarged end disposed opposite a respective one of the support element pads.

11. A method according to claim 9, further comprising the step of cleaning the top and bottom foil surfaces immediately after step (a) so as to remove any oxidized material.

12. A method according to claim 9, wherein the metal foil is selected from a group consisting of aluminum, copper and steel, the second metal is selected from a group consisting of nickel and gold, the third metal is selected from a group consisting of copper and nickel.

* * * * *

UNITED STATES PATENT AND TRADEMARK OFFICE
CERTIFICATE OF CORRECTION

PATENT NO.    : 6,475,703 B2
DATED         : November 5, 2002
INVENTOR(S)   : Delin Li et al.

It is certified that error appears in the above-identified patent and that said Letters Patent is hereby corrected as shown below:

<u>Column 6,</u>
Line 32, delete "multiplayer" and substitute -- multilayer -- in its place.

Signed and Sealed this

Twenty-fifth Day of March, 2003

JAMES E. ROGAN
*Director of the United States Patent and Trademark Office*